MICROWAVE SOLID-STATE OSCILLATOR DEVICE AND A METHOD FOR VARYING THE OSCILLATION FREQUENCY THEREOF
Filed Feb. 25, 1966

INVENTOR
KIICHI KOMATSUBARA

BY Paul M. Craig, Jr.
ATTORNEY

United States Patent Office 3,469,208
Patented Sept. 23, 1969

3,469,208

MICROWAVE SOLID-STATE OSCILLATOR DEVICE AND A METHOD FOR VARYING THE OSCILLATION FREQUENCY THEREOF

Kiichi Komatsubara, Kodaira-shi, Japan, assignor to Hitachi, Ltd., Tokyo-to, Japan Filed Feb. 25, 1966, Ser. No. 530,230
Claims priority, application Japan, Feb. 27, 1965, 40/10,984
Int. Cl. H03b 5/12, 7/12
U.S. Cl. 331—107 11 Claims

ABSTRACT OF THE DISCLOSURE

A microwave solid-state oscillator device is described which is comprised by a solid state oscillator unit comprising a piece of GaAs or InP coupled with a cavity resonator including a matching piston for adjusting the cavity capacitance and frequency of operation of the oscillator device. The solid-state oscillator unit is supplied with a high voltage pulse and is inserted between a stressing structure for applying a variable monoaxial stress force to the oscillator unit so that the oscillator operatively provides Gunn oscillation, and the frequency of the oscillation can be varied by varying the monoaxial stress force applied to the solid-state element.

This invention relates to a solid-state oscillator device and more particularly to a microwave solid-state oscillator device having a variable oscillation frequency thereof.

In 1963, Gunn with IBM reported that a microwave oscillation of 1,000∼10,000 mc. might be obtainable by applying a high voltage pulse to a piece of semiconductor, particularly of GaAs semiconductor in such a manner that a high electric field is formed therein, and providing the semiconductor with a microwave cavity resonator. Such phenomenon is known as "Gunn Oscillation."

Such a solid-state oscillator device has been expected to be substituted for a klystron oscillator device in the future. In actual use, it has also been recognized to be usable in numerous fields, such as in a microwave network system, a telemeter distress call system and so on.

The principle of the oscillation mechanism of the solid-state oscillator device has not been fully explained heretofore with reliability, however, all prior art devices were unable to control the variation or modification of the oscillation frequency thereof. Accordingly, if required, it was necessary to change a piece of semiconductor having a different size and a different impurity density contained therein. This made impossible a change of an oscillation frequency in case where such a semiconductor piece is fixedly installed in the device.

The prime object of this invention is to provide a new method for varying the oscillation frequency of a microwave solid-state oscillator device.

Another object of this invention is to provide a new microwave solid-state oscillator device having simple frequency varying means to easily change the oscillation frequency thereof.

Another object is to provide a microwave solid-state oscillator device having a wider range of variation of the frequency thereof than that of a klystron oscillator device.

Figure 1A:
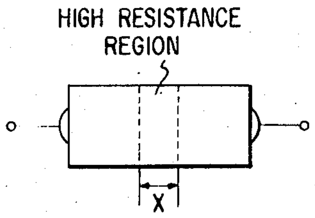
Figure 1B:
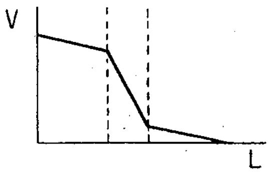
Figure 2:
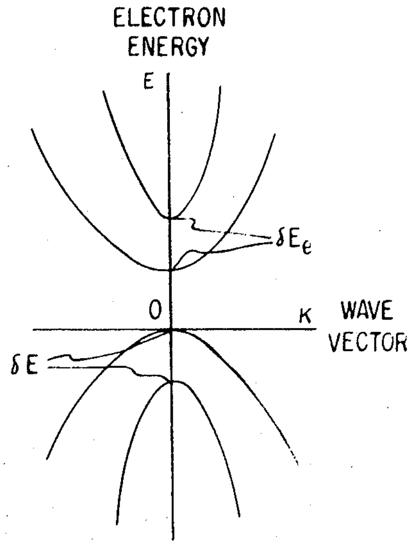
Figure 3:
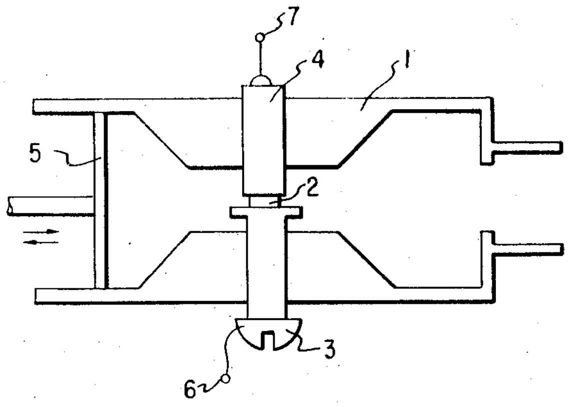

Further objects and features of this invention will be understood from the following description with reference to the accompanying drawings in which:

FIGURE 1*a* is a schematic showing of a piece of solid semiconductor or the like, called hereinafter a solid-state oscillator unit;

FIGURE 1*b* is a curve representing the voltage distribution within the solid oscillator unit of FIGURE 1*a*;

FIGURE 2 is a graph showing energy bands of a solid-state oscillator unit represented in the (E, *k*) diagram, and FIGURE 3 is a schematic showing of a microwave solid oscillator device in accordance with this invention.

To accomplish the aforestated objects, this invention is based on the following fact which underlies the discovery of this invention, that is, when a large stress force is applied to a solid-state oscillator unit, the oscillation frequency changes in accordance with the change of the magnitude of the stress force.

In the Proceedings of Physical Society, vol. 78, 1961, pages 293–304, Ridley discloses an oscillation mechanism. A completley satisfactory explanation of the phenomenon discovered by the present invention has not been found as yet, however, it seems to be similar to that of Ridley's conception. It is therefore considered that the oscillation mechanism of this invention may be caused by a high resistance region which appears in the oscillator unit piece as shown in FIGURE 1 when a high voltage is applied thereto.

In detail, a drift carrier is accelerated by a high voltage field appearing across the high resistance region and interrelated to a grid in the region, whereby the high resistance region is quickly moved, which causes an oscillation of a current flowing through the oscillator unit piece.

It is considered that the current oscillation phenomenon which is accompanied with the movement of the high voltage region, may take place in accordance with a sort of a feed back action of a carrier interband transition which is caused by either a phonon scattering or an impurity scattering accompanied with an Auger effect, since the carrier interband transition is formed by phonon in the high voltage field.

It has been discovered now that these scatterings could be variable over a wide range by applying a very large stress force, especially a monoaxial stress force to the oscillator unit.

Assuming that the carrier transition would be raised by interband transition, the interband energy difference $\delta E$, which contributes to the carrier transition, decreases in accordance with the increase of a stress force applied to an oscillator unit, and consequently the degree of the transition increases. Thus, the resistance ratio of a high resistance region to a low resistance region decreases and the oscillation frequency increases while the amplitude of the oscillation decreases.

On the other hand, if a drift carrier energy would be used for a plasma oscillation, i.e., the impurity scattering accompanying the Auger effect, an ionizing energy of an impurity contained in the oscillator material changes in accordance with an increase of an applied very large monoaxial stress force, so that the probability of a Coulomb scattering changes.

For instance, in the case that a solid oscillator unit piece is of GaAs, the ionizing energy is 0.15 ev. (Cu) or 0.02 ev. (Cd) while no stress force is applied, and it decreases to about 50–70% of the original value when a stress force of 5,000 kg./cm.$^2$ is applied. Accordingly, the usable energy for the Coulomb scattering would be decreased.

Throughout either of the two oscillation mechanisms, as explained above, the draft mobility becomes large while under a stress force, an oscillation frequency wherefore increases since it is presented by the equation $$W=2\pi f=\frac{\pi}{\tau}=\frac{\pi\nu}{X}$$

wherein $\tau$ is a carrier travelling time through a high resistance region X in a solid-state oscillator unit as shown in FIGURE 1*a*.

Referring now to FIGURE 3, the microwave oscillator device, illustrated therein, which is representative of one of numerous embodiments utilizing the principle of this invention, comprises a cavity resonator 1 preferably including a matching piston 5 for broadening the frequency band of the resonator.

Each support conductor 3 and 4 has an input terminal 6 and 7, respectively, electrically insulated within the resonator 1. Between the support conductors 3 and 4 is supported a piece of material forming the solid-state oscillation unit 2.

By any well-known method, such as by evaporation and sintering, an ohmic contact layer of tin is provided on the surface of the unit 2 within those areas thereof where the support conductors 3 and 4 adjoin thereto.

To provide an oscillation operation, a high voltage is supplied to the unit 2 from a conventional voltage source (not shown) through the support conductors 3 and 4.

According to the illustrated embodiment of the present invention, the conductor 3 is formed as a screw rotatably mounted in the resonator 1 to cooperate with the other conductor 4 as stress applying means in order to apply to the unit 2 a variable stress force by twisting the screw conductor 3 in or out of the resonator 1.

The support conductors 3 and 4 are preferably designed to serve not only as electric conductor but also as stress applying means in this embodiment. However, this invention is not restricted to such a structure. The means for applying a stress force to the unit 2 may also be constructed in various other forms of conventional structure.

Not only GaAs semiconductors but also some other III–V intermetallic compound such as InP and may be used as material for the solid-state oscillation unit. It has been found, however, that GaAs is the best material as regards efficiency thereof.

The operation and advantage of this invention will be described hereinafter in detail.

With solid-state oscillation units made of GaAs pieces each having different impurity of from about $10^{14}$ to $10^{16}$ atoms cc. and being of different thicknesses of from 0.05 mm. to 0.1 mm. with a cross section of 1 mm. square provided in the resonator 1 and with a 100 v. pulse voltage applied microwave oscillation frequency of 0.7–7 gc. are obtained under no stress condition and 1,500~20,000 mc. are obtained under a stress of 5,000 kg./cm.$^2$ condition accomplished by twisting the screw conductor 3. It is therefore apparent that the oscillation frequency under a stress condition is increased approximately 2–3 times from that in the original state.

In case a piece of 0.1 mm. thick and 1 mm.$^2$ in cross section of N-type GaAs semiconductor presented by an injection of Ga of $10^{15}$ atoms/cc. as an impurity is provided in a resonator and a 100 v. pulse voltage is applied thereto, a micro-wave oscillation frequency of approximately 15,000 mc. or 1.5 gc. is obtained under nonstress condition and 3,200 mc. or 3.2 gc. is obtained under a stress force of 5,000 kg./cm.$^2$. In addition thereto, the oscillation frequency is decreased under a stress force of less than 400 kg./cm.$^2$ in the latter case.

The upper limit of the stress force may be made under breakout of a unit piece.

According to this invention, the adjustment of the oscillation frequency may easily be accomplished despite the use of various oscillator unit pieces different in size and impurity density thereof. This is very advantageous, for example, in case of a microwave network system which requires very many oscillator devices having the same oscillation frequency.

The application of a stress force to an oscillation unit piece may be made by hand or in any other appropriate manner other than the way described above.

I claim:

1. A method for changing an oscillation frequency of a microwave solid-state oscillator device, which includes a solid-state oscillator unit operatively providing Gunn oscillation, resonator means accommodating therein said oscillator unit, and means for forming a high electric field in said solid-state oscillator unit, comprising the steps of applying a stress force to said oscillator unit and varying the stress force applied to said oscillator unit to vary the frequency of oscillations.

2. A microwave solid-state oscillator device comprising a solid-state oscillator unit operatively providing Gunn oscillation, means for supplying a high voltage to said oscillator unit so that a high electric field is formed therein, and means for selectively applying a variable stress force to said oscillator unit to control the oscillation frequency of the oscillator unit in response to the value of the applied stress force.

3. The combination according to claim 2, further comprising resonator means, said oscillator unit being secured in said resonator means.

4. A microwave solid-state oscillator device, comprising a cavity resonator including a matching piston for adjusting the cavity capacitance thereof, a solid-state oscillator unit operatively providing Gunn oscillation, means for supplying a high voltage pulse to said oscillator unit so that a pulsating high electric field is formed therein, and variable stressing means for applying a variable monoaxial stress force to said oscillator unit to control the oscillation frequency of the oscillator unit in response to the value of the applied stress force.

5. The combination according to claim 2, wherein said oscillator unit is selected from the group consisting of GaAs and InP.

6. The combination according to claim 3, wherein said oscillator unit is selected from the group consisting of GaAs and InP.

7. The combination according to claim 2, wherein said means for supplying the high voltage includes means for supplying high voltage pulses.

8. The combination according to claim 3, wherein said means for supplying the high voltage includes means for supplying high voltage pulses.

9. In a microwave solid oscillator device having a resonator, a solid state oscillator unit piece operatively providing Gunn oscillation secured in said resonator, and means for supplying a high voltage pulse to said oscillator unit piece the improvtment comprising oscillation frequency changing means including a pair of support conductors secured to said resonator for supporting therebetween said oscillator unit piece, one of said support conductors being a screw rotatably mounted in said resonator for applying different stress forces to said oscillator unit piece by rotating said screw thereby changing the oscillation frequency of said solid-state oscillator device in accordance with a change of said stress force.

10. The combination according to claim 4, wherein said oscillator unit is selected from the group consisting of GaAs and InP.

11. The combination according to claim 9, wherein said oscillator unit piece is selected from the group consisting of GaAs and InP.

References Cited

UNITED STATES PATENTS

| | | | |
|---|---|---|---|
| 2,899,646 | 8/1959 | Read | 331—96 |
| 3,168,713 | 2/1965 | Van Kessel | 331—107 |
| 3,270,293 | 8/1966 | De Loach et al. | 331—107 |
| 2,469,569 | 5/1949 | Ohl | 331—117 |

OTHER REFERENCES

J. B. Gunn, IBM Journal, "Instabilities of Current in III–V Semiconductors," pp. 141, 152, 153, April 1964.

R. Dobriner, Electronic Design, "Pace of Gunn-Effect Research Quickens," pp. 17, 18, 20, 21, Jan. 18, 1966.

J. B. Gunn, Solid State Comm., vol. 1, pp. 88–91, 1963.

M. Shyam et al., IEE Trans. Elect. Devices, "Effect of Var. of Energy Min. Separ. on Gunn OSC.," pp. 63–67, January 1966, vol. ed. 13, No. 1.

JOHN KOMINSKI, Primary Examiner

U.S. Cl. X.R.

317—234; 331—96